US012674846B2

(12) United States Patent
Yun et al.

(10) Patent No.: US 12,674,846 B2
(45) Date of Patent: Jul. 7, 2026

(54) SECONDARY BATTERY LIFE EVALUATION APPARATUS AND METHOD

(71) Applicant: SAMSUNG SDI CO., LTD., Yongin-si (KR)

(72) Inventors: Hee Soo Yun, Yongin-si (KR); Jee Ae Shim, Yongin-si (KR); Sun Ho Ryu, Yongin-si (KR); Joo Sick Jung, Yongin-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 145 days.

(21) Appl. No.: 18/646,840

(22) Filed: Apr. 26, 2024

(65) Prior Publication Data

US 2024/0385252 A1    Nov. 21, 2024

(30) Foreign Application Priority Data

May 16, 2023    (KR) ........................ 10-2023-0062872

(51) Int. Cl.
| | |
|---|---|
| *G01R 31/392* | (2019.01) |
| *G01R 31/388* | (2019.01) |
| *H01M 10/42* | (2006.01) |

(52) U.S. Cl.
CPC ......... *G01R 31/392* (2019.01); *G01R 31/388* (2019.01); *H01M 10/4285* (2013.01)

(58) Field of Classification Search
None
See application file for complete search history.

(56) References Cited

U.S. PATENT DOCUMENTS

| | | | |
|---|---|---|---|
| 7,830,126 | B2 | 11/2010 | Kawahara et al. |
| 9,153,845 | B2 * | 10/2015 | Tanaka ................... B60L 58/22 |
| 11,243,258 | B2 * | 2/2022 | Ramezan Pour Safaei ................ |
| | | | H02J 7/007192 |
| 2006/0152196 | A1 | 7/2006 | Matsumoto et al. |
| 2007/0247106 | A1 | 10/2007 | Kawahara et al. |

(Continued)

FOREIGN PATENT DOCUMENTS

| | | |
|---|---|---|
| CN | 112 834 944 A | 5/2021 |
| JP | 2007-282375 A | 10/2007 |

(Continued)

OTHER PUBLICATIONS

Nov. 27, 2024 Extended European Search Report in Patent Application Pub. No. 24 17 6180.

*Primary Examiner* — Richard Isla
(74) *Attorney, Agent, or Firm* — Venable LLP

(57) ABSTRACT

The present disclosure relates to an apparatus and method for secondary battery life evaluation. A state of charge (SOC) and a normal deterioration area for charge/discharge current of a secondary battery are established, the secondary battery is charged within the normal deterioration area of the secondary battery, an accelerated charging current is reduced as the SOC increases, the secondary battery is discharged within the normal deterioration area of the secondary battery, and an accelerated discharging current is reduced as the SOC decreases. Steps are repeated until a state of health (SOH) of the secondary battery reaches a reference SOH. By evaluating the accelerated life of the secondary battery within a normal deterioration range, the second battery life evaluation is highly reliable.

20 Claims, 14 Drawing Sheets

(56)                  References Cited

U.S. PATENT DOCUMENTS

| | | | |
|---|---|---|---|
| 2008/0265841 | A1 | 10/2008 | Kim |
| 2013/0166233 | A1 | 6/2013 | Suh et al. |
| 2014/0062415 | A1* | 3/2014 | Barsukov ............ H02J 7/00041 |
| | | | 320/152 |
| 2014/0333313 | A1 | 11/2014 | Surampudi et al. |
| 2017/0338666 | A1* | 11/2017 | Christensen ......... G01R 31/392 |
| 2018/0164384 | A1 | 6/2018 | Kwon et al. |
| 2020/0182942 | A1 | 6/2020 | Lee et al. |

FOREIGN PATENT DOCUMENTS

| | | | |
|---|---|---|---|
| KR | 10-2008-0096953 | A | 11/2008 |
| KR | 10-1927538 | B1 | 12/2018 |
| KR | 10-2010989 | B1 | 8/2019 |

* cited by examiner

Condition for generating side reaction $$\varphi_s - \varphi_e < 0V \ \& \ \varphi_s < 0V$$

$\varphi_s$: Active material potential
$\varphi_e$: Electrolyte potential
$C_s$: Li concentration in active material
$C_e$: Li+ concentration in electrolyte Deterioration control according to application of step charging Derivation of optimal charge pattern Charge Pattern @45oC

SECONDARY BATTERY LIFE EVALUATION APPARATUS AND METHOD

CROSS-REFERENCE TO RELATED APPLICATION

This application claims priority to and the benefit of Korean Patent Application No. 10-2023-0062872 filed on May 16, 2023, in the Korean Intellectual Property Office, the entire disclosure of which is incorporated herein by reference.

BACKGROUND

1. Field

The present disclosure relates to an apparatus and method for secondary battery life evaluation.

2. Description of the Related Art

Lithium-ion secondary batteries have been mainly produced as small batteries used in IT (Information Technology) devices such as mobile phones and laptops. But uses thereof have recently been expanding to medium/large power storage such as in electric vehicles and ESS (Energy Storage System), leading to an increase in the demand for large-capacity secondary batteries. Due to the nature of large-capacity applications, a long cycle life, high output, and safety are required.

Performance and cycle life tests of secondary batteries are essential for evaluation, improvement, and development of new products for market entry. In general, with respect to life characteristics of secondary batteries, accelerated life evaluation methods that increase environmental temperature or charging/discharging current are mainly used.

However, conventional accelerated life evaluation methods may cause abnormal battery deterioration when an acceleration condition exceeds a normal deterioration condition, thereby lowering the reliability of accelerated life evaluation methods.

The information disclosed in this background section is only for enhancement of understanding of the background of the invention and it may contain information that does not constitute prior art.

SUMMARY

The present disclosure provides a highly reliable secondary battery life evaluation apparatus and method wherein the evaluation involves accelerated life of a secondary battery within a normal deterioration range in which abnormal deterioration does not occur.

A secondary battery life evaluation method according to the present disclosure may include: a first step in which a state of charge (SOC) and a normal deterioration area for charging/discharging current of a secondary battery are established; a second step in which the secondary battery is charged within the normal deterioration area of the secondary battery, and an accelerated charging current is reduced as the SOC increases; and a third step in which the secondary battery is discharged within the normal deterioration area of the secondary battery, and an accelerated discharging current is reduced as the SOC decreases, wherein the second and third steps are repeated until a state of health (SOH) of the secondary battery reaches a reference SOH.

In some embodiments, the normal deterioration area may be an area where the condition for generating a side reaction in the secondary battery is not satisfied.

In some embodiments, the condition for generating a side reaction in the secondary battery may satisfy both a first condition in which a difference between an electrical potential ($\varphi_s$) of an electrically active material and an electrical potential ($\varphi_e$) Of an electrolyte is less than 0 V and a second condition in which the electrical potential (($\varphi_s$) of an electrically active material is less than 0 V.

In some embodiments, the accelerated charging current may decrease stepwise or slopewise.

In some embodiments, the accelerated discharging current may decrease stepwise or slopewise.

In some embodiments, the accelerated charging current may be 0.1 to 5 times a reference charging current.

In some embodiments, the accelerated discharging current may be 0.1 to 6 times the reference discharging current.

In some embodiments, the reference SOH may be 80% to 90%.

In some embodiments, the second and third steps may be repeated until a DC-IR of the secondary battery reaches 120% to 130%.

In some embodiments, an acceleration factor (AF) of the secondary battery may be calculated by DC-IR increase rate (%)/capacity degradation rate (%), and the calculated acceleration factor may be 1.5 to 2.5.

A secondary battery life evaluation apparatus according to the present disclosure may include: a control circuit; a processor installed in the control circuit; and a memory installed in the control circuit and operably connected to the processor, wherein the processor executes a program code stored in the memory to perform: a first step in which a state of charge (SOC) and a normal deterioration area for charging/discharging current of a secondary battery are input; a second step in which the secondary battery is charged within the normal deterioration area of the secondary battery, and an accelerated charging current is reduced as the SOC increases; and a third step in which the secondary battery is discharged within the normal deterioration area of the secondary battery, and an accelerated discharging current is reduced as the SOC decreases, and the processor is configured such that the second and third steps are repeated until a state of health (SOH) of the secondary battery reaches a reference SOH.

DETAILED DESCRIPTION

Figure 1:
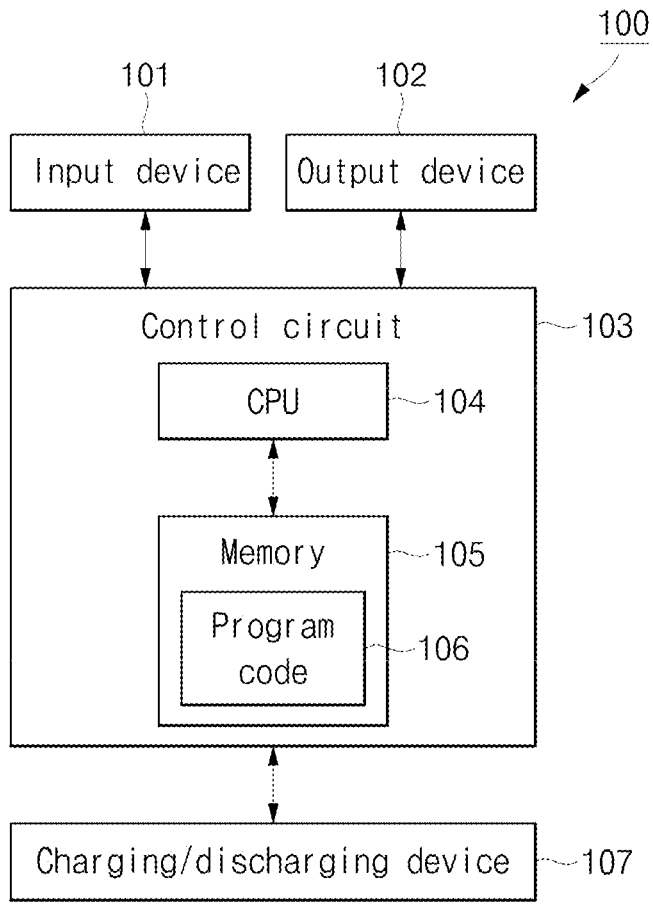
FIG. 1 is a block diagram showing the configuration of a life evaluation apparatus for testing the cycle life of a secondary battery according to an embodiment of the present disclosure.

Hereinafter, preferred embodiments of the present disclosure will be described in detail with reference to the accompanying drawings.

Examples of the present disclosure are provided to more completely explain the present disclosure to those skilled in the art, and the following examples may be modified in various other forms. The present disclosure, however, may be embodied in many different forms and should not be construed as being limited to the example (or exemplary) embodiments set forth herein. Rather, these example embodiments are provided so that this disclosure will be thorough and complete and will convey the aspects and features of the present disclosure to those skilled in the art.

In addition, in the accompanying drawings, like numbers refer to like elements. As used herein, the term "and/or" includes any and all combinations of one or more of the associated listed items. The terminology used herein is for the purpose of describing particular embodiments only and is not intended to be limiting of the disclosure. As used herein, the singular forms are intended to include the plural forms as well, unless the context clearly indicates otherwise. It will be further understood that the terms that the terms "comprise" and/or "comprising," when used in this specification, specify the presence of stated features, numbers, steps, operations, elements, and/or components, but do not preclude the presence or addition of one or more other features, numbers, steps, operations, elements, components, and/or groups thereof.

In addition, the control circuit and/or any other relevant devices or components according to embodiments of the present disclosure may be implemented utilizing any suitable hardware, firmware (e.g. an application-specific integrated circuit), software, or a suitable combination of software, firmware, and hardware. For example, the various components of the devices described herein may be formed on one integrated circuit (IC) chip or on separate IC chips. Further, the various components of the control circuit and/or other devices may be implemented on a flexible printed circuit film, a tape carrier package, a printed circuit board, or formed on a same substrate as the control circuit and/or other devices. Further, the various components of the control circuit and/or other devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory. The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

FIG. 1 is a block diagram showing the configuration of a life evaluation apparatus for testing the cycle life of a secondary battery, according to an embodiment of the present disclosure. As shown in FIG. 1, an exemplary life evaluation apparatus 100 according to an embodiment of the present disclosure may include an input device 101, an output device 102, a control circuit 103, a central processing unit (CPU) 104, a memory 105, a program code 106, and a charging/discharging device 107.

The control circuit 103 may execute the program code 106 stored in the memory 105 through the CPU 104 and may control the overall operation of the life evaluation apparatus 100 accordingly.

The life evaluation apparatus 100 may receive data or information input by a user through the input device 101, such as a keyboard or a mouse, and may output images or sounds through the output device 102, such as a monitor or a speaker.

In the memory 105, various set values (e.g., a normal deterioration area or an abnormal deterioration area, a state of health (SOH), a charging current profile, a discharging current profile, etc.) for implementation of the present disclosure, and the program code 106 for controlling the operation of the charging/discharging device 107, may be stored.

The charging/discharging device 107 may be controlled by the control circuit to charge a secondary battery to be subjected to life evaluation by providing current and voltage to the secondary battery or to discharge the secondary battery by connecting a load to the secondary battery.

Figure 2:
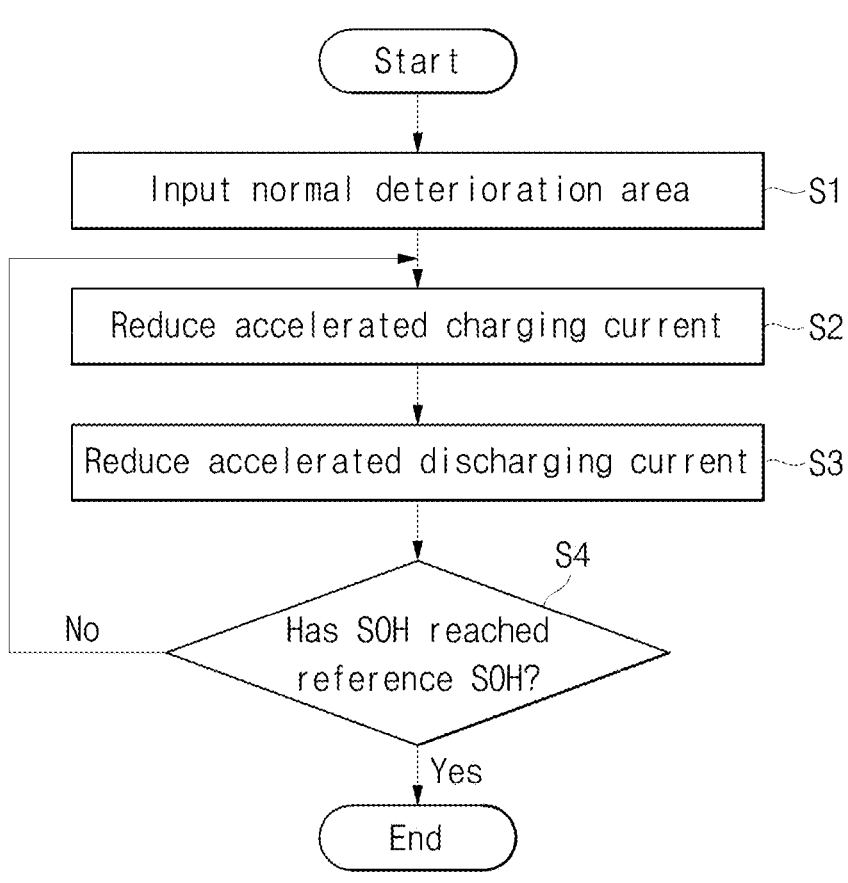
FIG. 2 is a flow chart showing an exemplary life evaluation method according to an embodiment of the present disclosure.

FIG. 2 is a flow chart showing an exemplary life evaluation method according to an embodiment of the present disclosure. As shown in FIG. 2, the exemplary life evaluation method according to an embodiment of the present disclosure may include a normal deterioration area input step S1, an accelerated charging current reduction step S2, an accelerated discharging current reduction step S3, and a state of health (SOH) comparison step S4.

In the normal deterioration area input step S1, the state of charge (SOC) of the secondary battery and a normal deterioration area or an abnormal deterioration area for charging/discharging current may be input to the control circuit 103 through the input device 101, and these may be stored in the memory 105 as set values. The meaning and derivation method of the normal deterioration area or the abnormal deterioration area will be described again below.

In the accelerated charging current reduction step S2, the secondary battery connected to the charging/discharging device 107 may be subjected to accelerated charging by a control signal of the control circuit 103. In some embodiments, the accelerated charging of the secondary battery may be configured to be performed within the normal deterioration area rather than the abnormal deterioration area. In some embodiments, the accelerated charging of the secondary battery may be configured so that the accelerated charging current decreases as the SOC or voltage of the secondary battery increases. In some embodiments, the accelerated charging current may be configured to decrease stepwise or slopewise as the SOC or voltage of the secondary battery increases. The charging operation may be configured to stop when a preset SOC or voltage of the secondary battery is reached.

In the accelerated discharging current reduction step S3, the secondary battery connected to the charging/discharging device 107 may be subjected to accelerated discharging by a control signal from the control circuit 103. In some embodiments, the accelerated discharging of the secondary battery may be configured to be performed within the normal deterioration area rather than the abnormal deterioration area. In some embodiments, the accelerated discharging of the secondary battery may be configured so that the accelerated discharging current decreases as the SOC or voltage of the secondary battery decreases. In some embodiments, the accelerated discharging current may be configured to decrease stepwise or slopewise as the SOC or voltage of the secondary battery decreases. The discharging operation may be configured to stop when a preset SOC or voltage of the secondary battery is reached. In this way, if accelerated charging and accelerated discharging of a secondary battery are performed once, the cycle life of the secondary battery may be defined as one cycle elapsed.

In the SOH comparison step S4, the control circuit 103 may compare whether the current SOH of the secondary battery has reached a preset reference SOH after one cycle. In some embodiments, if the SOH of the secondary battery has not reached the reference SOH, the control circuit 103 may be configured to repeat the steps S2 and S3, and if the SOH of the secondary battery has reached the reference SOH, the control circuit 103 may be configured to stop charging and discharging of the secondary battery.

In some embodiments, the steps S2 and S3 are performed between approximately 40° C. and approximately 50° C. to ensure that the acceleration condition of the secondary battery is satisfied. In addition, in the step S4, for example, a reference performance test (RPT) is performed at approximately 20° C. to approximately 30° C., and, thus, the SOH of the secondary battery is measured and compared in an environment similar to a normal state.

Figure 3A:
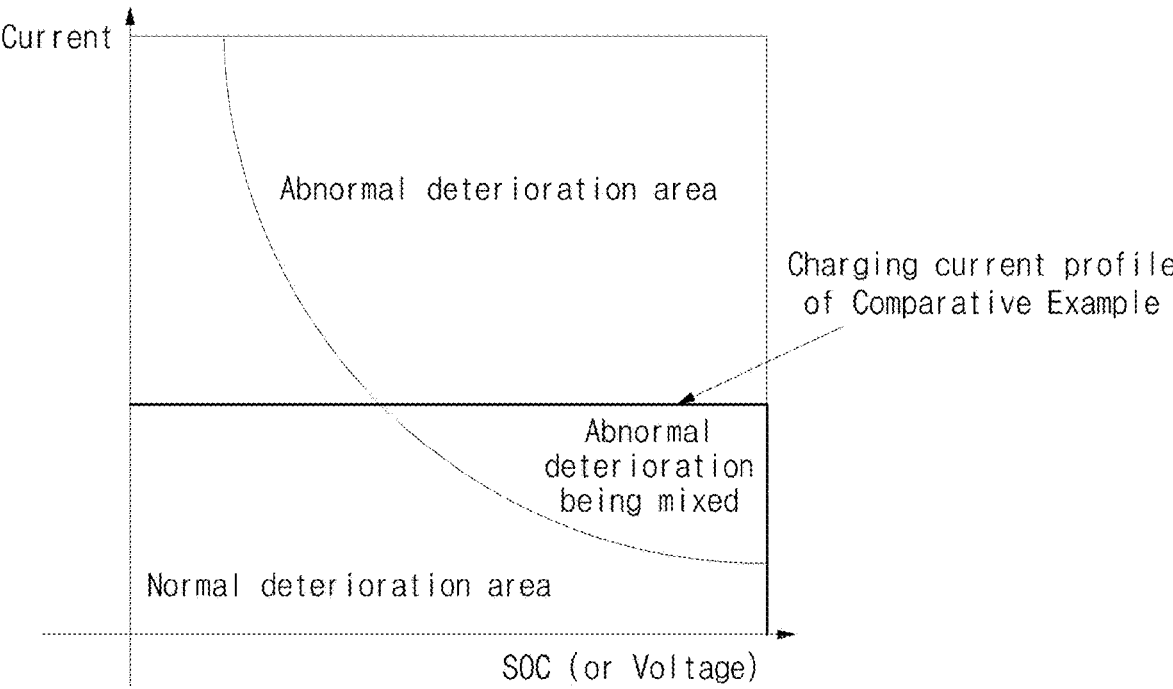
FIG. 3A is a graph for explaining an accelerated life evaluation method according to a Comparative Example.
Figure 3B:
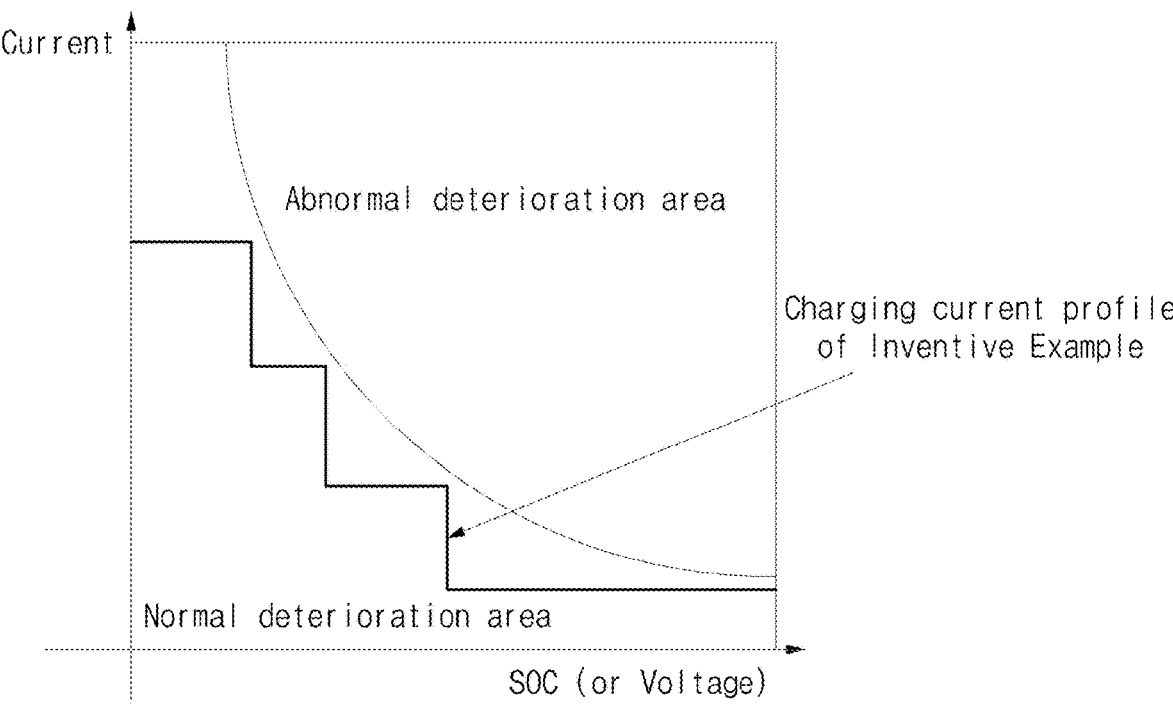
FIG. 3B is a graph for explaining an accelerated life evaluation method according to an example of the present disclosure.

FIG. 3A is a graph for explaining an accelerated life evaluation method according to a Comparative Example, and FIG. 3B is a graph for explaining an accelerated life evaluation method according to an example of the present disclosure. In FIGS. 3A and 3B, the X-axis indicates the SOC or voltage, and the Y-axis indicates the charging/discharging current. As shown in FIGS. 3A and 3B, a normal deterioration area and an abnormal deterioration area may be defined between SOC (or voltage) and charging/discharging current. In some embodiments, the normal deterioration area may decrease approximately exponentially as the SOC increases. In some embodiments, in a state in which the SOC is relatively high, the charging/discharging current must be relatively low for the secondary battery to be placed in the normal deterioration area. In some embodiments, in a state in which the SOC is low, even if the charging/discharging current is relatively high, the secondary battery may be placed in the normal deterioration area. In other words, in a case where the higher the SOC, the lower the charging/discharging current, and the lower the SOC, the higher the charging/discharging current, the secondary battery may be placed in the normal deterioration area.

As shown in FIG. 3A, in the Comparative Example, by applying constant charging/discharging current regardless of SOC (e.g., constant current charging), the secondary battery may be placed in the abnormal deterioration area in a specific SOC range (e.g., a relatively high SOC range). When the accelerated secondary battery life evaluation is performed in an abnormal deterioration area, there is a problem that the correlation between the acceleration condition and the cycle life cannot be accurately determined.

As shown in FIG. 3B, in an example of the present disclosure, charging/discharging current may be varied depending on the SOC, thereby enabling the secondary battery to be placed in the normal deterioration area in any SOC range. In some embodiments, as the SOC increases, the accelerated charging current may decrease stepwise or slopewise (e.g., step-down charging). Similarly, as the SOC decreases, the accelerated discharging current may also decrease stepwise or slopewise.

In this way, in an example of the present disclosure, by adjusting the charging/discharging current according to the SOC or voltage, the secondary battery life evaluation is performed within a normal deterioration range. In some embodiments, the cycle life evaluation period can be shortened by using the maximum charging/discharging current available within the range in which abnormal deterioration does not occur. In some embodiments, the evaluation period can be shortened by approximately 50% compared to the condition of the Comparative Example, with the development period of a secondary battery thereby being shortened.

Figure 4A:
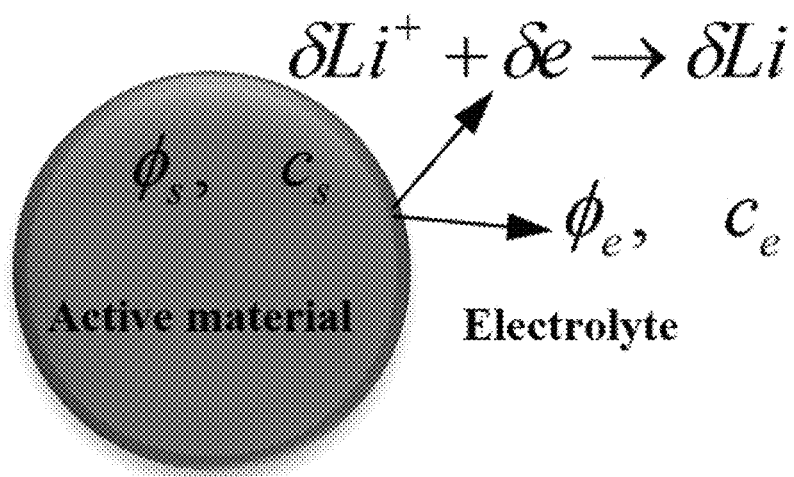
FIG. 4A is a schematic diagram showing a method for predicting an abnormal deterioration condition by using an electrochemical model to derive a normal deterioration area and an abnormal deterioration area in the secondary battery life evaluation method according to an example of the present disclosure.

FIG. 4A is a schematic diagram showing a method for predicting an abnormal deterioration condition by using an electrochemical model to thereby derive a normal deterioration area and an abnormal deterioration area in the secondary battery life evaluation method according to an example of the present disclosure. One embodiment of the present disclosure may provide optimal accelerated charging and discharging conditions, which maximally suppress the abnormal deterioration and shortened cycle life due to side reactions during accelerated charging and discharging of a secondary battery. In an example of the present disclosure, the abnormal deterioration condition (e.g., occurrence of Li-plating) can be predicted by using an electrochemical model. In some embodiments, the normal deterioration area may be an area where the condition for generating a side reaction in a secondary battery is not satisfied. Conversely, the abnormal deterioration area may be an area where the condition for generating a side reaction in a secondary battery is satisfied.

In general, the physical quantity of an electrically active material of a positive electrode that constitutes a secondary battery may be expressed by an electrical potential ($\varphi_s$) and a lithium (Li) concentration ($C_s$) in the electrically active material, and the physical quantity of an electrolyte may also be expressed by an electrical potential ($\varphi_s$) and a lithium ion ($Li^+$) concentration ($C_e$) in the electrolyte.

Here, it is known that lithium (Li) metal is plated or precipitated when lithium ions ($Li^+$) and electrons (e) are bonded to each other on the surface of a negative electrode.

In other words, it is known that a condition for generating a side reaction in a secondary battery occurs when both a difference between an electrical potential ($\varphi_s$) of an electrically active material and an electrical potential ($\varphi_e$) of an electrolyte is less than 0 V and the electrical potential ($\varphi_s$) of an electrically active material is less than 0 V (see mathematical formula below):

$$\varphi_s - \varphi_e < 0V \text{ and } \varphi_s < 0V$$

In general, the area where the condition for generating a side reaction is satisfied can be defined as an abnormal deterioration area, and the area where the condition for generating a side reaction is not satisfied can be defined as a normal deterioration area.

In some embodiments, as described above, in the normal deterioration area where the condition for generating a side reaction is not satisfied, the charging and discharging current depending on SOC, voltage, and/or temperature can be predicted.

Figure 4B:
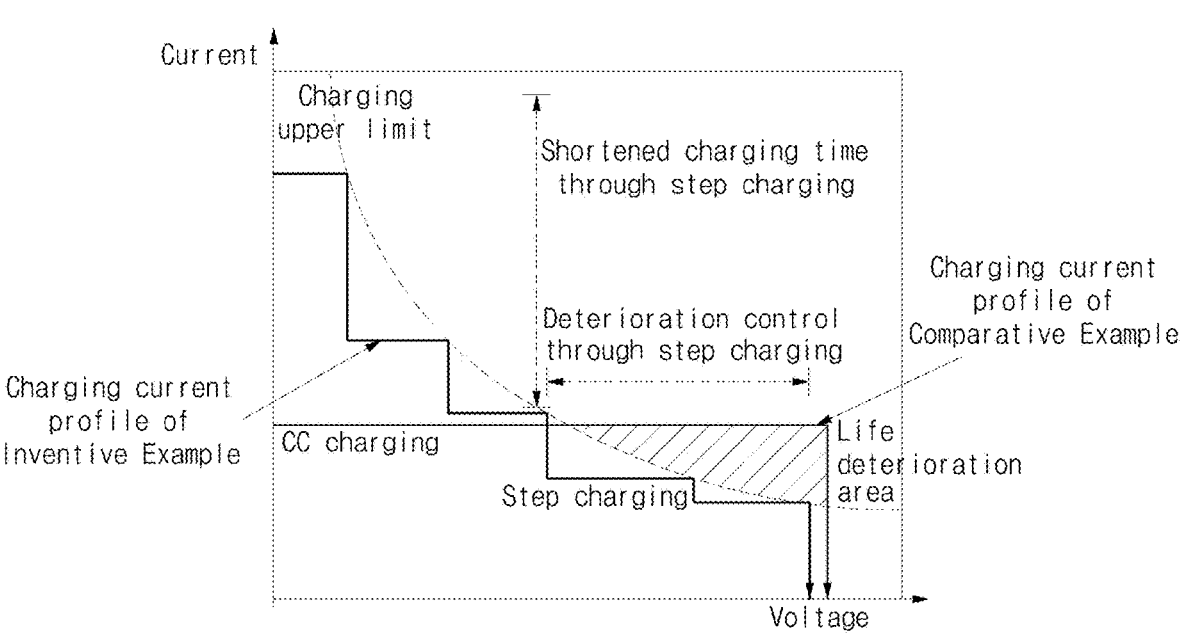
FIG. 4B is a graph for explaining deterioration control states according to an example of the present disclosure and the Comparative Example.

FIG. 4B is a graph for explaining deterioration control states according to an example of the present disclosure and the Comparative Example. In FIG. 4B, the X-axis indicates the voltage or SOC, and the Y-axis indicates the charging/discharging current. As shown in FIG. 4B, in the Comparative Example a constant charging/discharging current is applied regardless of the voltage of a secondary battery (e.g., constant current charging) such that the secondary battery may be placed in a life deterioration area (see shaded area) when the voltage/SOC of the secondary battery is relatively high.

However, in an example of the present disclosure, when the voltage/SOC of the secondary battery is low, a relatively high charging/discharging current is supplied, and when the voltage/SOC of the secondary battery is high, a relatively low charging/discharging current is supplied. Thus, the secondary battery is not in a life deterioration area during a secondary battery cycle life test.

In some embodiments, in a voltage range/SOC in which life deterioration is low, the charging time can be shortened by providing a higher charging current than in the Comparative Example. And in a voltage range in which life deterioration is high, secondary battery life deterioration can be minimized by providing a lower charging current than in the Comparative Example. In some embodiments, the charging current may be supplied stepwise or slopewise in both of the range in which life deterioration is low and the range in which life deterioration is high.

Figure 4C:
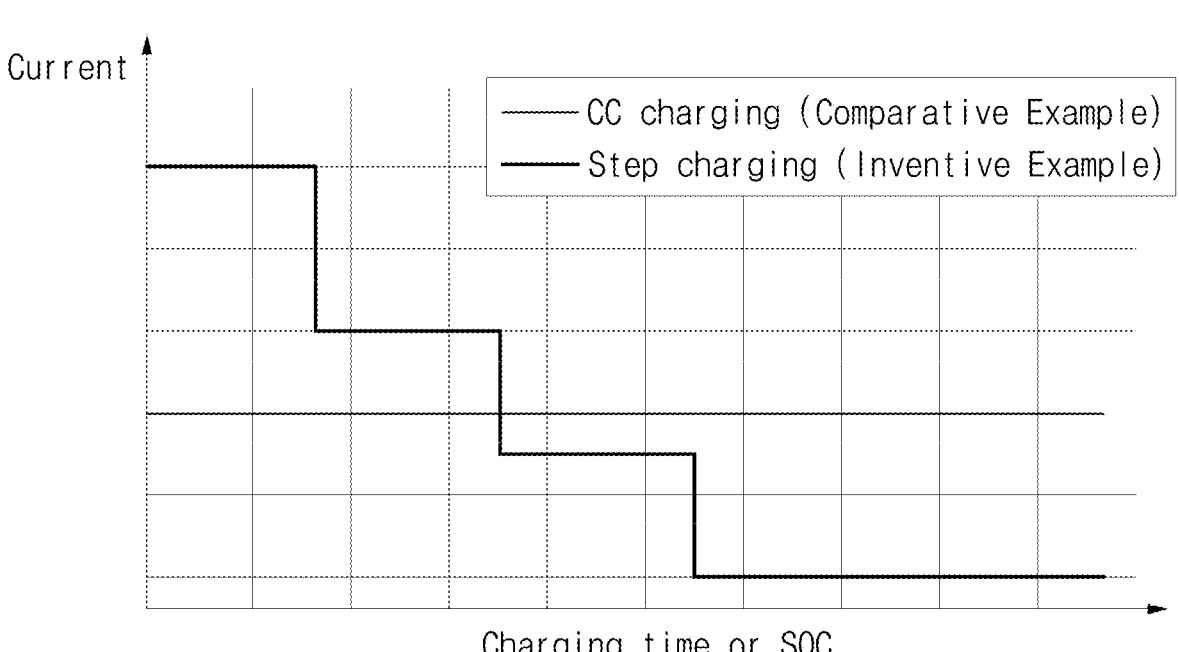
FIG. 4C is a graph for explaining charge patterns according to an example of the present disclosure and the Comparative Example.

FIG. 4C is a graph showing charge patterns according to an example of the present disclosure and the Comparative Example. In FIG. 4C, the X-axis indicates the charging time or SOC, and the Y-axis indicates the charging current. As shown in FIG. 4C, in the Comparative Example, the current for constant current charging is supplied regardless of the charging time or SOC, and in an example of the present disclosure, the charging current is supplied in a step-down manner as the charging time or SOC increases. In some embodiments, the charging current may be approximately 0.1 times to approximately 5 times the reference charging current (e.g., the charging current in the Comparative Example). In some embodiments, in a normal deterioration area, the charging current may be higher than the reference charging current, and in an abnormal deterioration area, the charging current may be lower than the reference charging current. Likewise, the discharging current may be 0.1 to 6 times the reference discharging current. In some embodiments, in the normal deterioration area, the discharging current may be higher than the reference discharging current, and in the abnormal deterioration area, the discharging current may be lower than the reference discharging current.

Figure 4D:
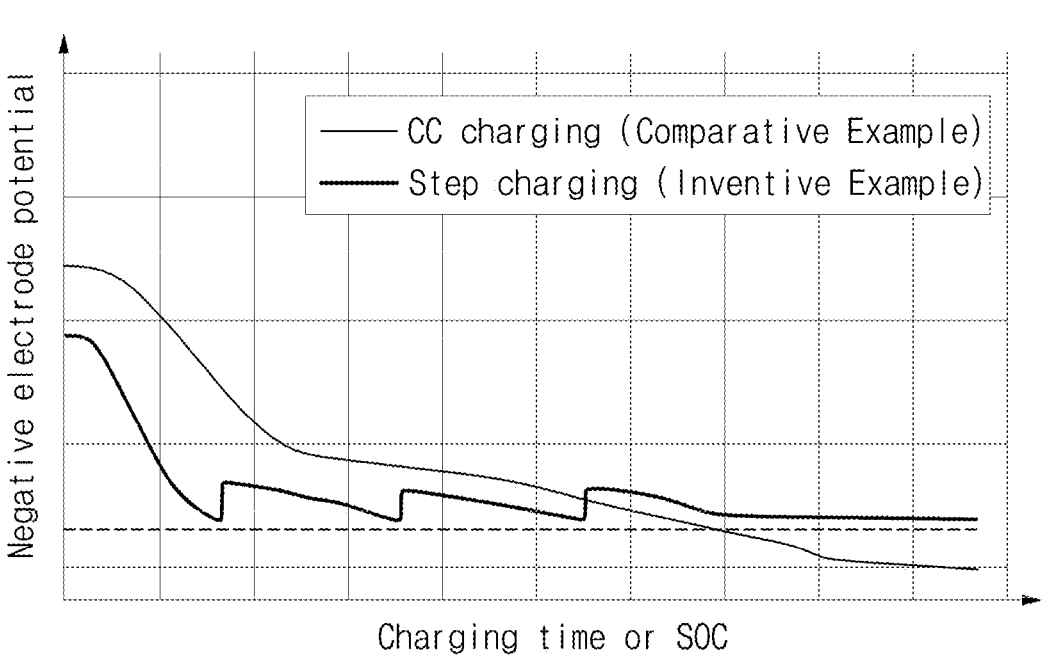
FIG. 4D is a graph for explaining changes in negative electrode potentials according to an example of the present disclosure and the Comparative Example.

FIG. 4D is a graph showing changes in negative electrode potentials according to an example of the present disclosure and the Comparative Example. In FIG. 4D, the X-axis indicates the charging time or SOC, and the Y-axis indicates the negative electrode potential. As shown in FIG. 4D, in the Comparative Example, as the charging time or SOC increases, the negative electrode potential decreases with a constant slope, and thus the negative electrode potential eventually lies in an abnormal deterioration area. However, in an example of the present disclosure, as the charging time or SOC increases, the charging current is supplied in a step-down manner, and thus the negative electrode potential may not be placed in the abnormal deterioration area.

Hereinafter, the accelerated cycle test according to the present disclosure and the normal cycle test according to the Comparative Example will be described.

Figure 5A:
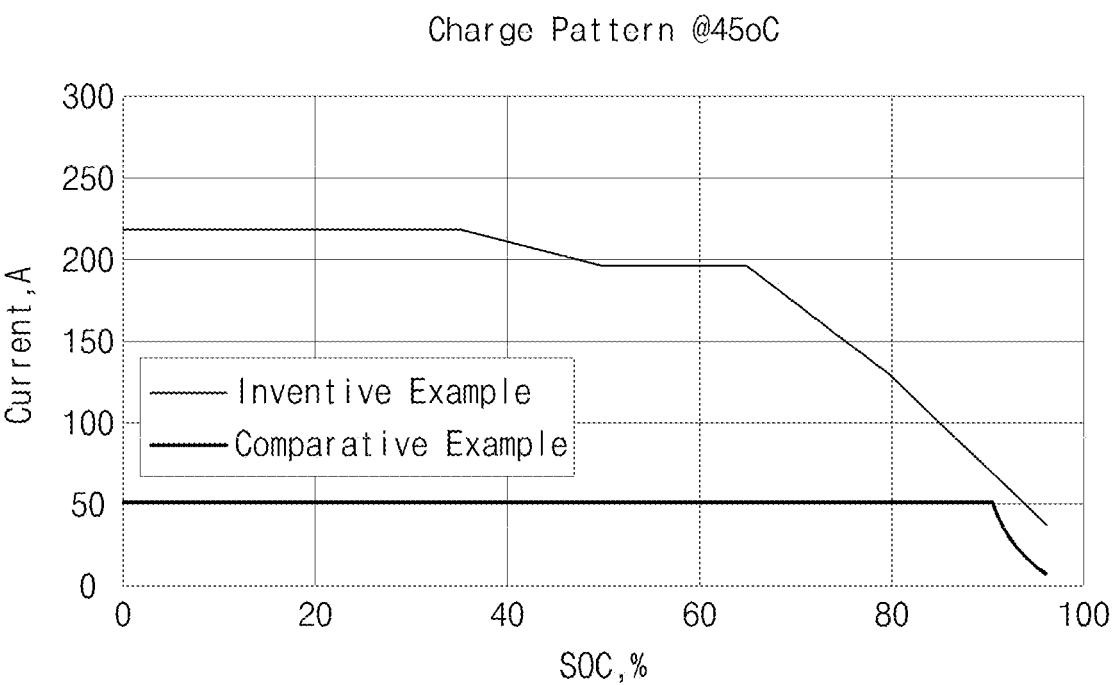
FIG. 5A is a graph for explaining charge patterns according to an example of the present disclosure and the Comparative Example.

FIG. 5A is a graph showing charge patterns according to an example of the present disclosure and the Comparative Example. In FIG. 5A, the X-axis indicates the SOC (%), and the Y-axis indicates the charging current (A). As shown in FIG. 5A, in the Comparative Example constant charging/discharging current was supplied regardless of the SOC (constant current of approximately 50 A), and in an example of the present disclosure, as the SOC increases, the charging current was supplied in a step-down manner (step-down current from approximately 220 A to approximately 50 A). In this embodiment, the test was performed at approximately 45° C.

Figure 5B:
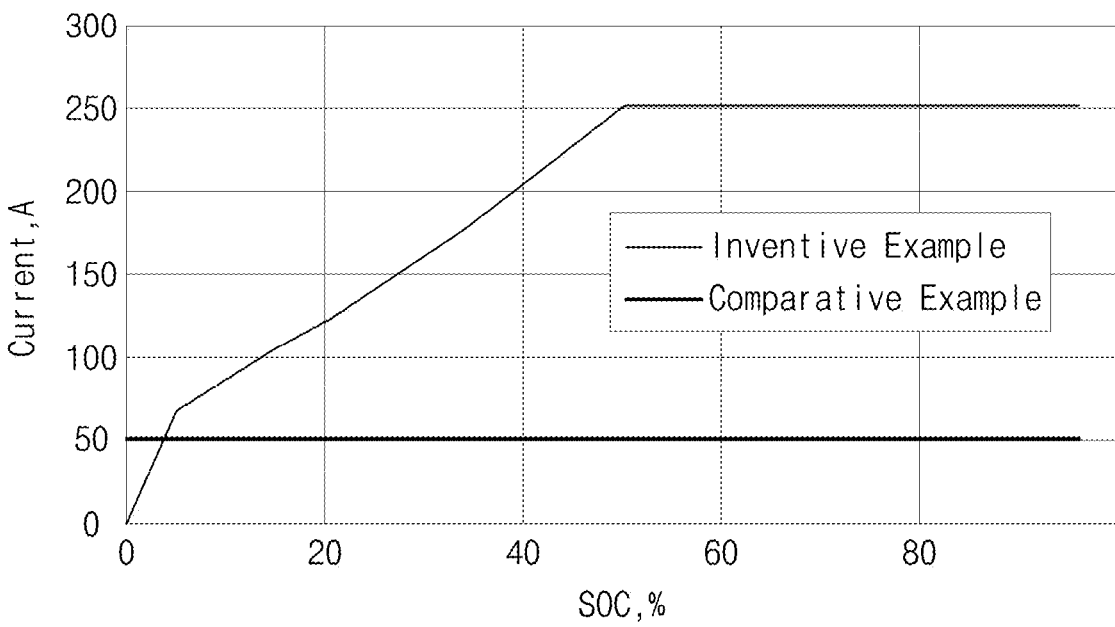
FIG. 5B is a graph for explaining discharge patterns according to an example of the present disclosure and the Comparative Example.

FIG. 5B shows discharge patterns according to an example of the present disclosure and the Comparative Example. In FIG. 5B, the X-axis indicates the SOC (%), and the Y-axis indicates the discharging current (A). As shown in FIG. 5B, in the Comparative Example constant discharging current was supplied regardless of SOC (constant current of approximately 50 A), but in an example of the present disclosure, as the SOC decreases, the discharging current was supplied in a step-down manner (step-down current from approximately 250 A to approximately 0 A).

Figure 5C:
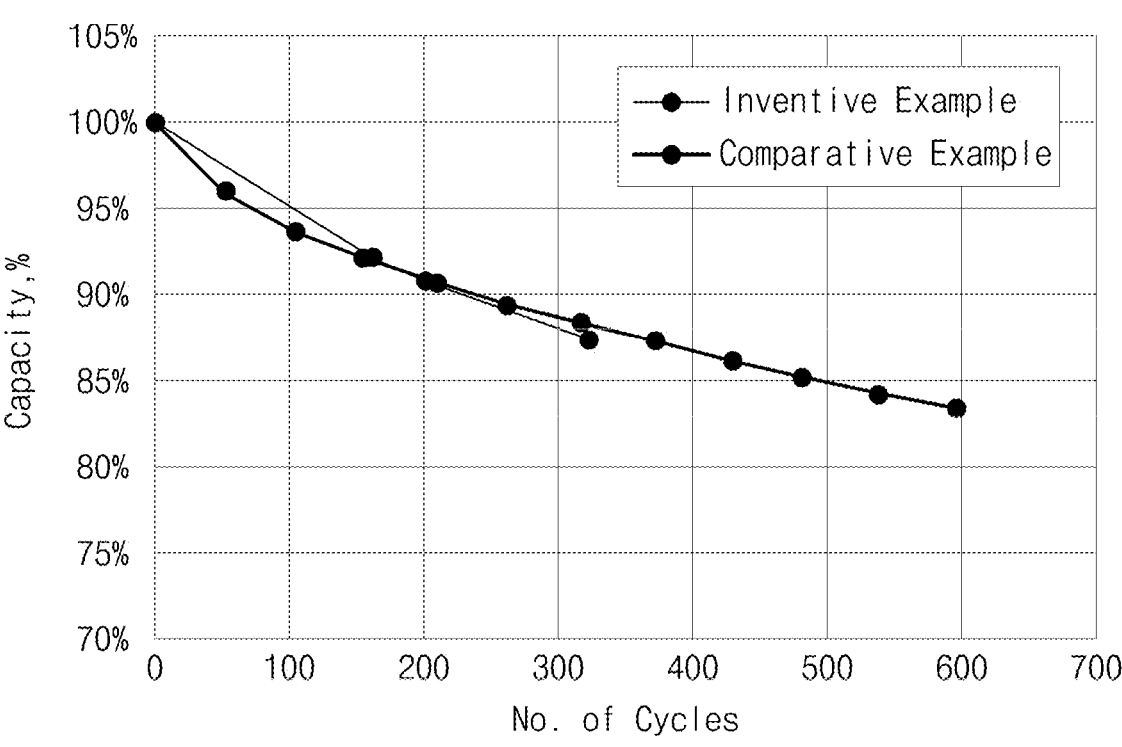
FIG. 5C is a graph for explaining capacity deterioration patterns according to an example of the present disclosure and the Comparative Example.

FIG. 5C is a graph showing capacity deterioration patterns according to an example of the present disclosure and the Comparative Example. In FIG. 5C, the X-axis indicates the number of charge/discharge cycles, and the Y-axis indicates the capacity (%). As shown in FIG. 5C, in both of the Comparative Example and the present disclosure the battery capacity decreases as the number of charge/discharge cycles increases.

Figure 5D:
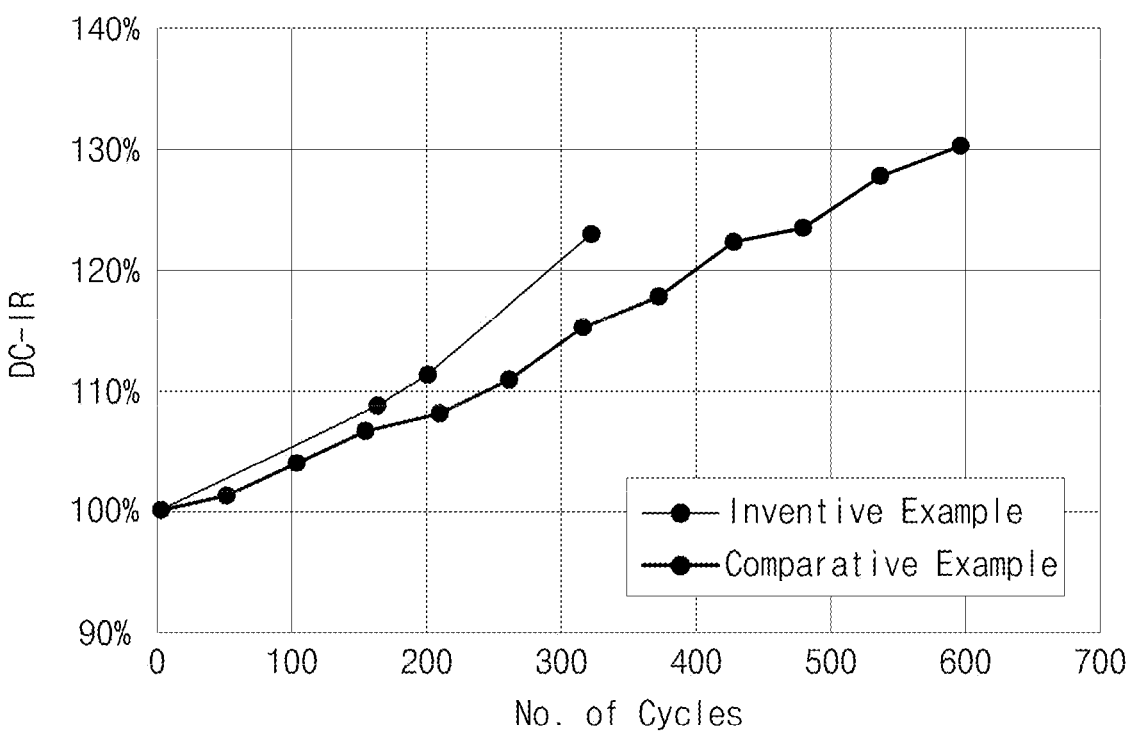
FIG. 5D is a graph for explaining resistance change patterns according to an example of the present disclosure and the Comparative Example.

FIG. 5D is a graph showing resistance change patterns according to an example of the present disclosure and the Comparative Example. In FIG. 5D, the X-axis indicates the number of charge/discharge cycles, and the Y-axis indicates the direct current internal resistance (DC-IR) (%). As shown in FIG. 5D, as the number of charge/discharge cycles increases, DC-IR of the present disclosure increases more than the Comparative Example.

Figure 5E:
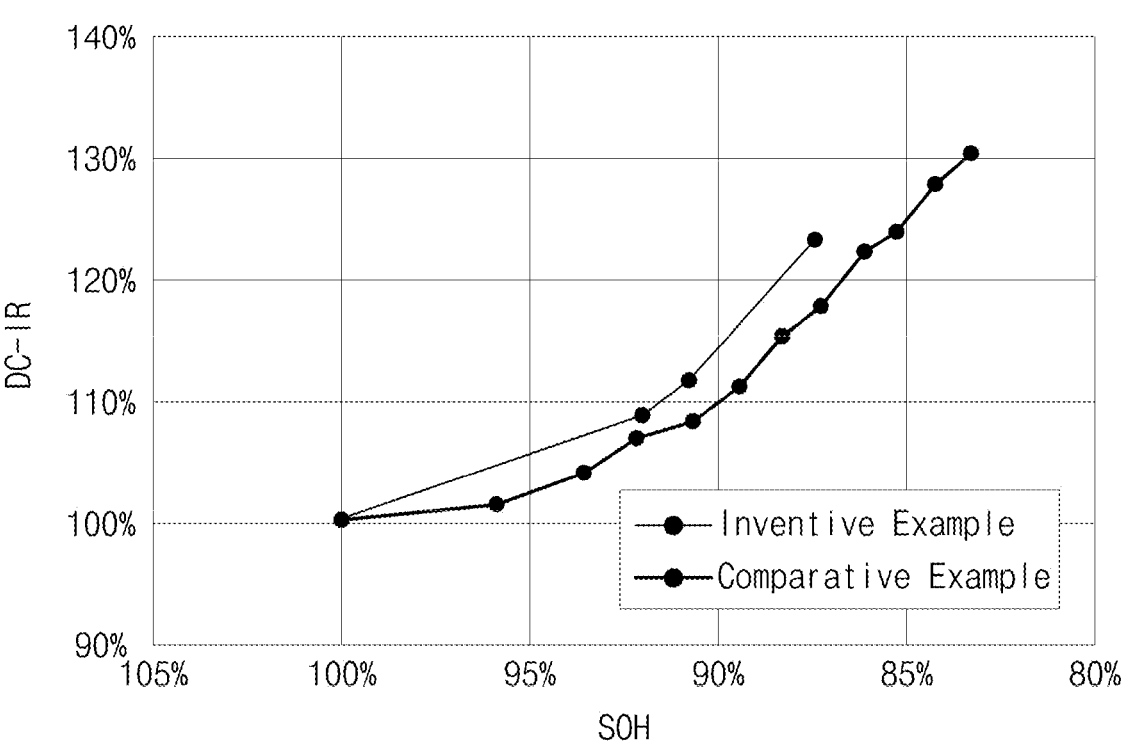
FIG. 5E is a graph for explaining SOH vs. DC-IR patterns according to an example of the present disclosure and the Comparative Example.

FIG. 5E is a graph showing SOH vs. DC-IR patterns according to an example of the present disclosure and the Comparative Example. In FIG. 5E, the X-axis indicates the charge/discharge SOH (%), and the Y-axis indicates the DC-IR (%). As shown in FIG. 5E, as the SOH decreases, the DC-IR of the present disclosure increases more than in the Comparative Example. In some embodiments, a reference SOH may be set to approximately 80% to approximately 90%, and the accelerated cycle life test of the secondary battery may be performed when the SOH reaches the reference SOH. In some embodiments, the accelerated cycle life test of the secondary battery may be performed until the DC-IR reaches approximately 120% to approximately 130%.

FIG. 5E confirms that even though the life evaluation conditions for the life evaluation method according to the Comparative Example and the accelerated life evaluation method according to an example of the present disclosure were different, the ratio of the DC-IR increase rate to the SOH of the secondary battery (slope) was roughly constant. It is generally acknowledged in the art that when the slope angle of a straight line drawn between the X and Y axes in FIG. 5E is approximately 30° to 60°, the evaluation method is a highly reliable acceleration evaluation method. Therefore, the accelerated life evaluation method according to the present disclosure can be considered to have excellent reliability.

In addition, as a reliability standard for the accelerated life evaluation method, an acceleration factor (AF) may be used. For example, the acceleration factor can be calculated using the equation below:

$$\text{Acceleration factor (AF)} = \text{DC-IR increase rate (\%)}/\text{capacity degradation rate (\%)}$$

For example, as shown in FIG. 5E, in an example of the present disclosure (accelerated cycles), when the SOH of the secondary battery changes from approximately 100% to approximately 87.5%, the DC-IR changes from approximately 100% to approximately 124%. That is, in an example of the present disclosure, the capacity degradation rate of the secondary battery is approximately 12.5%, the DC-IR increase rate is approximately 24%, and the acceleration factor of the secondary battery is calculated to be approximately 1.9 (A.F=24/12.5=1.9). Accordingly, in an example of the present disclosure, the acceleration factor of the secondary battery may be limited to approximately 1.5 to approximately 2.5, and the cycle life of the secondary battery may be evaluated in a state in which the secondary battery is not placed in an abnormal deterioration area.

In addition, as shown in FIG. 5E, in the Comparative Example (normal cycles), when the SOH of the secondary battery changes from approximately 100% to approximately 86%, the DC-IR changes from approximately 100% to approximately 123%. That is, in the Comparative Example, the capacity degradation rate of the secondary battery is approximately 14%, the DC-IR increase rate is approximately 23%, and the acceleration factor of the secondary battery is calculated to be approximately 1.6 (AF=23/14=1.6).

Since there is no significant difference between the acceleration factor according to an example of the present disclosure and the acceleration factor according to the Comparative Example, it can be seen that the life evaluation of the secondary battery according to an example of the present disclosure is performed in a normal deterioration area rather than in an abnormal deterioration area. Further, in the conventional secondary battery life evaluation method, the acceleration factor was in the range of approximately 3 to approximately 8, and, thus, life evaluation was performed in the abnormal deterioration area of the secondary battery, which is problematic in that the life evaluation reliability is poor.

Figure 5F:
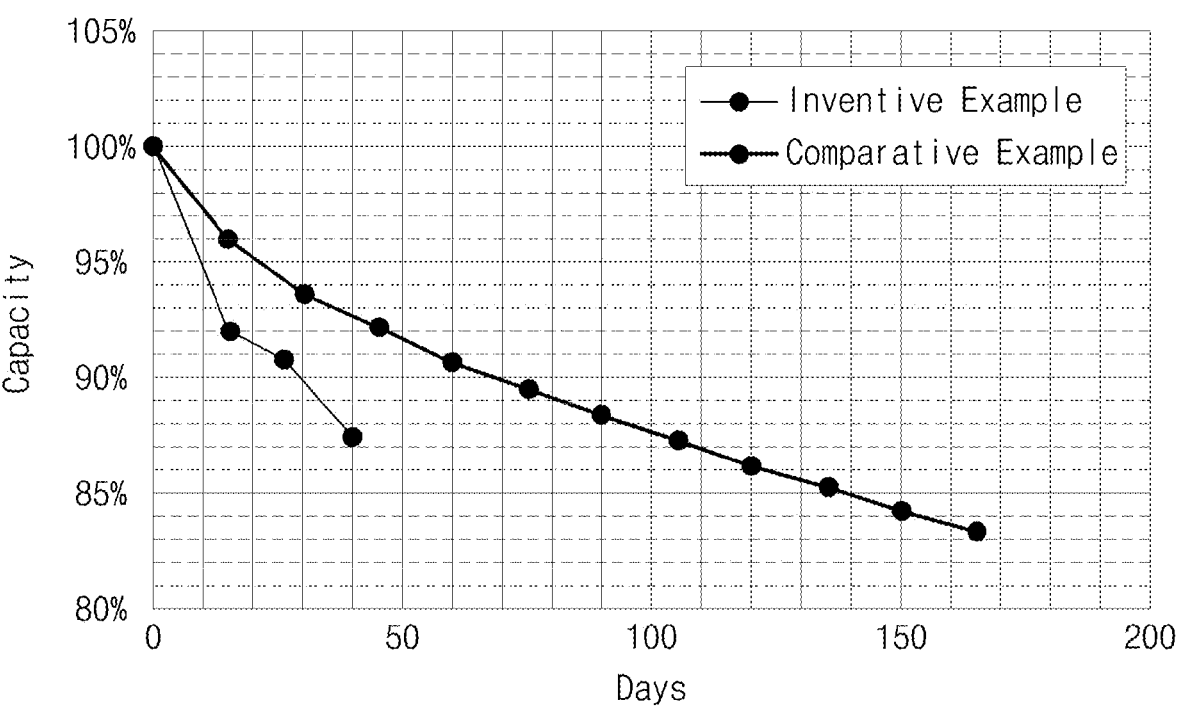
FIG. 5F is a graph for explaining evaluation periods according to an example of the present disclosure and the Comparative Example.

FIG. 5F is a graph showing evaluation periods according to an example of the present disclosure and the Comparative Example. In FIG. 5F, the X-axis indicates the evaluation days, and the Y-axis indicates the battery capacity (%). As shown in FIG. 5F, in the Comparative Example, it took approximately 105 days for the capacity to decrease to approximately 87%, but in an example of the present disclosure, it took approximately 40 days for the capacity to decrease to approximately 87%. Therefore, it can be seen that the secondary battery life evaluation period of the present disclosure was shortened by approximately 65 days compared to that of the Comparative Example.

As described herein, the present disclosure provides a highly reliable secondary battery life evaluation apparatus and method in which accelerated life of a secondary battery is within a normal deterioration range in which abnormal deterioration does not occur. For example, the present disclosure provides a highly reliable secondary battery life evaluation apparatus and method that prevent abnormal deterioration of the secondary battery by allowing an accelerated life evaluation to proceed as the current size changes depending on the SOC, voltage, or depth of charge of the secondary battery. In addition, the present disclosure provides a secondary battery life evaluation apparatus and method that can shorten the development period of new secondary batteries by shortening the evaluation period required for general battery life evaluation.

While the foregoing embodiments are only exemplary embodiments for carrying out a secondary battery life evaluation apparatus according to the present disclosure, and a method thereof, and the present disclosure is not limited thereto. It will be understood by a person skilled in the art that various changes in form and details may be made therein without departing from the spirit and scope of the present disclosure as defined by the following claims.

What is claimed is:

1. A secondary battery life evaluation method comprising:
    a first step in which a state of charge (SOC) and a normal deterioration area for charge/discharge current of a secondary battery are established, wherein the normal deterioration area decreases as the SOC increases such that in a state in which the SOC is high, the charge/discharge current is low, and in a state in which the SOC is low, the charge/discharge current is high;
    a second step in which the secondary battery is charged within the normal deterioration area of the secondary battery and an accelerated charging current is reduced as the SOC increases; and
    a third step in which the secondary battery is discharged within the normal deterioration area of the secondary battery and an accelerated discharging current is reduced as the SOC decreases,
    wherein the second and third steps are repeated until a state of health (SOH) of the secondary battery reaches a reference SOH, and
    wherein the accelerated charging current and the accelerated discharging current are maximum currents available within the normal deterioration area to shorten an evaluation period of the secondary battery.

2. The secondary battery life evaluation method as recited in claim 1, wherein the normal deterioration area is an area where the condition for generating a side reaction in the secondary battery is not satisfied.

3. The secondary battery life evaluation method as recited in claim 2, wherein the condition for generating a side reaction in the secondary battery satisfies both a first condition in which a difference between an electrical potential $(\varphi_s)$ of an electrically active material and an electrical potential $(\varphi_e)$ of an electrolyte is less than 0 V and a second condition in which the electrical potential $(\varphi_s)$ of the electrically active material is less than 0 V.

4. The secondary battery life evaluation method as recited in claim 1, wherein the accelerated charging current decreases stepwise or slopewise.

5. The secondary battery life evaluation method as recited in claim 1, wherein the accelerated discharging current decreases stepwise or slopewise.

6. The secondary battery life evaluation method as recited in claim 1, wherein the accelerated charging current is 0.1 to 5 times a reference charging current.

7. The secondary battery life evaluation method as recited in claim 1, wherein the accelerated discharging current is 0.1 to 6 times a reference discharging current.

8. The secondary battery life evaluation method as recited in claim 1, wherein the reference SOH is 80% to 90%.

9. The secondary battery life evaluation method as recited in claim 1, wherein the second and third steps are repeated until a direct current internal resistance (DC-IR) of the secondary battery reaches 120% to 130%.

10. A secondary battery life evaluation method comprising:

a first step in which a state of charge (SOC) and a normal deterioration area for charge/discharge current of a secondary battery are established;

a second step in which the secondary battery is charged within the normal deterioration area of the secondary battery and an accelerated charging current is reduced as the SOC increases; and a third step in which the secondary battery is discharged within the normal deterioration area of the secondary battery and an accelerated discharging current is reduced as the SOC decreases, wherein the second and third steps are repeated until a state of health (SOH) of the secondary battery reaches a reference SOH, and wherein an acceleration factor of the secondary battery is calculated as DC-IR increase rate (%) divided by capacity degradation rate (%), and the calculated acceleration factor is 1.5 to 2.5.

11. A secondary battery life evaluation apparatus comprising:

a control circuit;

a processor installed in the control circuit; and a memory installed in the control circuit and operably connected to the processor, wherein the processor executes a program code stored in the memory to perform:

a first step in which a state of charge (SOC) and a normal deterioration area for charge/discharge current of a secondary battery are input to the apparatus, wherein the normal deterioration area decreases as the SOC increases such that in a state in which the SOC is high, the charge/discharge current is low, and in a state in which the SOC is low, the charge/discharge current is high;

a second step in which the secondary battery is charged within the normal deterioration area of the secondary battery, and an accelerated charging current is reduced as the SOC increases; and a third step in which the secondary battery is discharged within the normal deterioration area of the secondary battery, and an accelerated discharging current is reduced as the SOC decreases, and the processor is configured such that the second and third steps are repeated until a state of health (SOH) of the secondary battery reaches a reference SOH, and wherein the accelerated charging current and the accelerated discharging current are maximum currents available within the normal deterioration area to shorten an evaluation period of the secondary battery.

12. The secondary battery life evaluation apparatus as recited in claim 11, wherein the normal deterioration area is an area where the condition for generating a side reaction in the secondary battery is not satisfied.

13. The secondary battery life evaluation apparatus as recited in claim 12, wherein the condition for generating a side reaction in the secondary battery satisfies both a first condition in which a difference between an electrical potential $(\varphi_s)$ of an electrically active material and an electrical potential $(\varphi_e)$ of an electrolyte is less than 0 V and a second condition in which the electrical potential $(\varphi_s)$ of the electrically active material is less than 0 V.

14. The secondary battery life evaluation apparatus as recited in claim 11, wherein the accelerated charging current decreases stepwise or slopewise.

15. The secondary battery life evaluation apparatus as recited in claim 11, wherein the accelerated discharging current decreases stepwise or slopewise.

16. The secondary battery life evaluation apparatus as recited in claim 11, wherein the accelerated charging current is 2 to 5 times a reference charging current.

17. The secondary battery life evaluation apparatus as recited in claim 11, wherein the accelerated discharging current is 2 to 6 times a reference discharging current.

18. The secondary battery life evaluation apparatus as recited in claim 11, wherein the reference SOH is 80% to 90%.

19. The secondary battery life evaluation apparatus as recited in claim 11, wherein the second and third steps are repeated until a DC-IR of the secondary battery reaches 120% to 130%.

20. The secondary battery life evaluation apparatus as recited in claim 11, wherein an acceleration factor (AF) of the secondary battery is calculated by DC-IR increase rate (%) divided by capacity degradation rate (%), and the calculated acceleration factor is 1.5 to 2.5.

* * * * *